United States Patent
Hardin et al.

(10) Patent No.: US 8,043,470 B2
(45) Date of Patent: Oct. 25, 2011

(54) ELECTRODE/PROBE ASSEMBLIES AND PLASMA PROCESSING CHAMBERS INCORPORATING THE SAME

(75) Inventors: Randall A. Hardin, Miamisburg, OH (US); Jon Keihl, Versailles, OH (US); Shannon Spencer, Huber Heights, OH (US)

(73) Assignee: Lam Research Corporation, Freemont, CA (US)

( * ) Notice: Subject to any disclaimer, the term of this patent is extended or adjusted under 35 U.S.C. 154(b) by 1007 days.

(21) Appl. No.: 11/943,673

(22) Filed: Nov. 21, 2007

(65) Prior Publication Data

US 2009/0126633 A1    May 21, 2009

(51) Int. Cl.
*H01L 21/00* (2006.01)
*C23C 14/00* (2006.01)
*C23C 16/00* (2006.01)

(52) U.S. Cl. ......... 156/345.34; 156/345.24; 156/345.47; 118/715; 118/723 R

(58) Field of Classification Search ............. 156/345.34, 156/345.47; 118/715, 723 R
See application file for complete search history.

(56) References Cited

U.S. PATENT DOCUMENTS

| | | | |
|---|---|---|---|
| 4,211,040 A | 7/1980 | Steudten et al. | |
| 5,458,688 A | 10/1995 | Watanabe | |
| 5,846,373 A | 12/1998 | Pirkle et al. | |
| 5,869,149 A | 2/1999 | Denison et al. | |
| 5,933,314 A | 8/1999 | Lambson et al. | |
| 6,042,901 A | 3/2000 | Denison et al. | |
| 6,071,573 A | 6/2000 | Koemtzopoulos et al. | |
| 6,106,678 A | 8/2000 | Shufflebotham et al. | |
| 6,184,158 B1 | 2/2001 | Shufflebotham et al. | |
| 6,391,786 B1 | 5/2002 | Hung et al. | |
| 6,491,784 B2 * | 12/2002 | Yamaguchi et al. | 156/345.34 |
| 6,719,875 B1 | 4/2004 | Ohmi et al. | |
| 6,841,943 B2 | 1/2005 | Vahedi et al. | |
| 6,984,288 B2 | 1/2006 | Dhindsa et al. | |
| 7,060,355 B2 | 6/2006 | Nakano et al. | |
| 7,244,311 B2 | 7/2007 | Fischer | |
| 7,276,135 B2 | 10/2007 | Dhindsa et al. | |
| 2007/0284246 A1 * | 12/2007 | Keil et al. | 204/298.36 |

FOREIGN PATENT DOCUMENTS

| | | |
|---|---|---|
| JP | 7009285 | 1/1995 |
| JP | 8274068 | 10/1996 |

* cited by examiner

*Primary Examiner* — Ram N. Kackar
(74) *Attorney, Agent, or Firm* — Dinsmore & Shohl LLP

(57) ABSTRACT

The present invention relates generally to plasma processing chambers and electrode assemblies used therein. According to one embodiment, an electrode assembly comprises a thermal control plate, a silicon-based showerhead electrode, and a probe assembly comprising an electrically conductive probe body and a silicon-based cap. The electrode assembly is configured such that the handedness of a threaded engagement of the silicon-based cap and a head section of the probe body and the handedness of the threaded engagement of the thermal control plate and a mid-section of the probe body have a common direction of rotation. Thereby, an application of torque to the silicon-based cap in a tightening direction of rotation tightens both threaded engagements. Further, the electrode assembly is configured such that the threaded engagement of the silicon-based cap and a head section of the probe body permits repetitive non-destructive engagement and disengagement of the silicon-based cap and the probe body.

20 Claims, 3 Drawing Sheets

ELECTRODE/PROBE ASSEMBLIES AND PLASMA PROCESSING CHAMBERS INCORPORATING THE SAME

BACKGROUND

The present invention relates generally to plasma processing and, more particularly, to plasma processing chambers and electrode assemblies used therein. Plasma processing apparatuses can be used to process substrates by a variety of techniques including, but not limited to, etching, physical vapor deposition, chemical vapor deposition, ion implantation, resist removal, etc. For example, and not by way of limitation, one type of plasma processing chamber contains an upper electrode, commonly referred to as a showerhead electrode, and a bottom electrode. An electric field is established between the electrodes to excite a process gas into the plasma state to process substrates in the reaction chamber. Embodiments of plasma processing chambers and showerhead electrode assemblies used therein are described in U.S. patent application Ser. No. 11/871,586, filed Oct. 12, 2007, the entire disclosure of which is hereby incorporated by reference.

BRIEF SUMMARY

According to one embodiment of the present invention, an electrode assembly is provided comprising a thermal control plate, a silicon-based showerhead electrode, and a probe assembly, wherein the probe assembly is electrically isolated from the silicon-based showerhead electrode and comprises an electrically conductive probe body and a silicon-based cap configured of a silicon-based material substantially identical to that of the silicon-based showerhead electrode. The electrically conductive probe body comprises a head section comprising a threaded external diameter configured to mate with a threaded internal diameter of the silicon-based cap so as to releasably engage the silicon-based cap and the probe body and permit repetitive non-destructive engagement and disengagement of the silicon-based cap and the probe body. The electrically conductive probe body comprises a mid-section comprising a threaded external diameter configured to mate with a threaded internal diameter of a plate-based probe assembly passage of the thermal control plate so as to releasably engage the thermal control plate and the probe body. The electrode assembly is configured such that the handedness of the threaded engagement of the silicon-based cap and the head section of the probe body and the handedness of the threaded engagement of the thermal control plate and the mid-section of the probe body are of a common direction of rotation such that an application of torque to the silicon-based cap in a tightening direction of rotation can tighten both the threaded engagement of the silicon-based cap and the head section of the probe body and the threaded engagement of the thermal control plate and the mid-section of the probe body.

In accordance with another embodiment of the present invention, a plasma processing chamber is provided comprising a vacuum source, a process gas supply, a plasma power supply, a substrate support, and an upper electrode assembly fabricated to incorporate one or more of the aspects of the present invention.

In accordance with yet another embodiment of the present invention, an electrode assembly is provided comprising a thermal control plate, a silicon-based showerhead electrode, a probe assembly, and an o-ring, wherein the o-ring is configured to form a gas tight seal between the threaded engagement of the mid-section of the probe body and the thermal control plate and a gap defined between a periphery of the probe assembly and the internal diameter of the electrode-based probe assembly passage of the showerhead electrode.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

Figure 3:
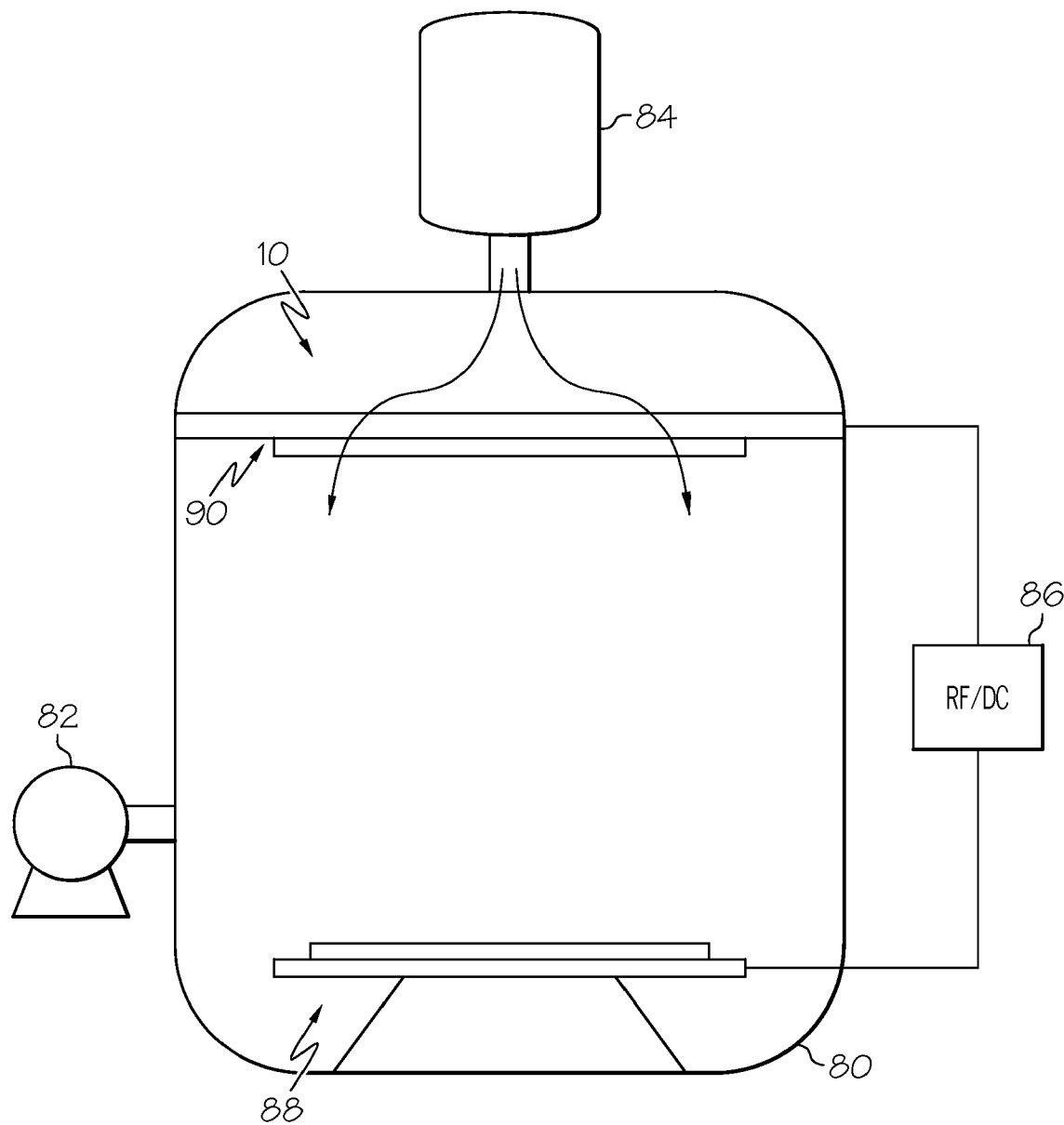
FIG. 3 is a schematic illustration of a plasma processing chamber incorporating particular aspects of some embodiments of the present invention.

The various aspects of the present invention can be illustrated in the context of a plasma processing chamber 10, which is merely illustrated schematically in FIG. 3 to avoid limitation of the concepts of the present invention to particular plasma processing configurations, or components, that may not be integral to the subject matter of the present invention. As is generally illustrated in FIG. 3, the plasma processing chamber 80 comprises a vacuum source 82, a process gas supply 84, a plasma power supply 86, a substrate support 88 including a lower electrode assembly, and an upper electrode assembly 10, also referred to herein simply as an electrode assembly 10.

Figure 2:
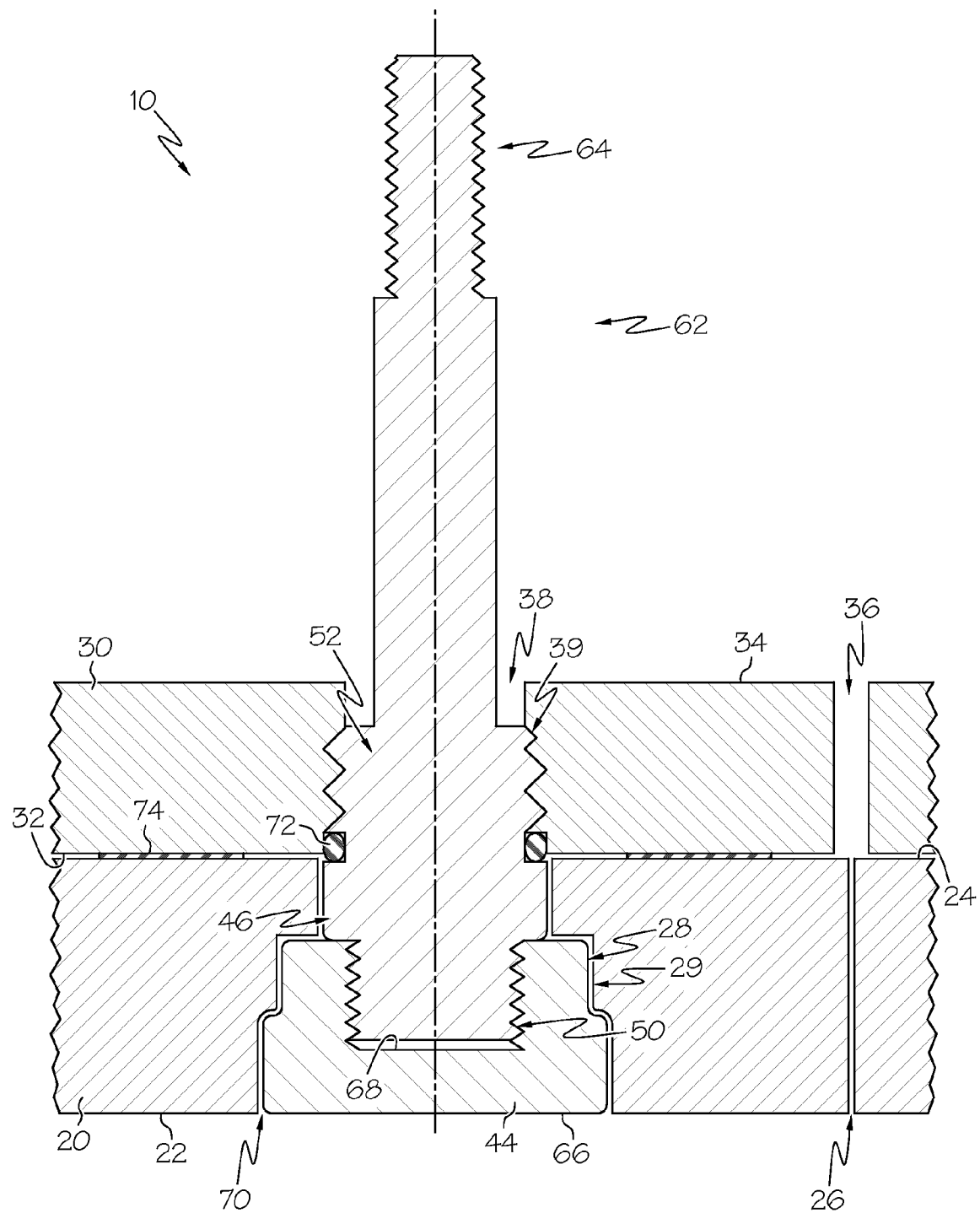
FIG. 2 is a cross-sectional view of an electrode assembly according to one embodiment of the present invention.

Referring to FIG. 2, an electrode assembly 10 generally comprises a silicon-based showerhead electrode 20, a thermal control plate 30, and a probe assembly 40. The probe assembly 40 generally is configured to monitor an electric charge of a reactive species in communion with an electrode assembly 10 positioned within a plasma processing chamber. As such, the probe assembly 40 generally is electrically isolated from the silicon-based showerhead electrode 20. Thereby, an electric current of the showerhead electrode 20 substantially does not interfere with the monitoring of the electric charge by the probe assembly 40. The electric isolation of the probe assembly 40 may be provided by a gap 70. This gap 70 generally is defined between a periphery 45 of the probe assembly 40 and an internal diameter 29 of an electrode-based probe assembly passage 28 of the silicon-based showerhead electrode 20.

Figure 1:
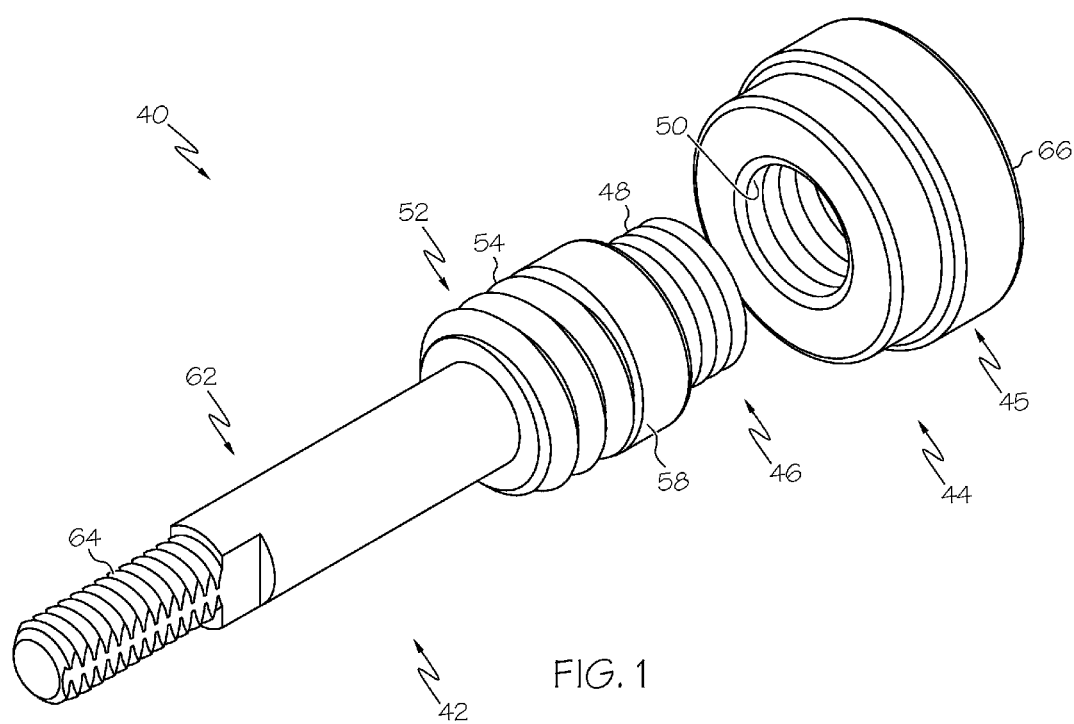
FIG. 1 is an illustration of a probe assembly according to one embodiment of the present invention.

Referring to FIG. 1, the probe assembly 40 may comprise an electrically conductive probe body 42 and a silicon-based cap 44. According to one embodiment, the electrically conductive probe body 42 is configured substantially of aluminum. It is contemplated, however, that the electrically conductive probe body 42 may be configured substantially of one or more of any electrically conductive materials. The silicon-based cap 44, however, is configured of a silicon-based material substantially identical in composition to that of the silicon-based showerhead electrode 20, which aids in preventing the probe assembly 40 from contaminating a reactive species in communication with the electrode assembly 10. According to one embodiment, the silicon-based material of the silicon-based cap 44 comprises single crystal silicon. According to another embodiment, the silicon-based material of the silicon-based cap 44 comprises polysilicon, silicon nitride, silicon carbide, boron carbide, aluminum nitride, aluminum oxide, or combinations thereof.

The thermal control plate 30, shown in cross-section in FIG. 2, generally comprises a frontside 32, a backside 34, one or more gas passages 36 configured to direct a process gas to the frontside 32 of the thermal control plate 30, and a plate-based probe assembly passage 38 configured to permit passage of at least a portion of the electrically conductive probe body 42.

The silicon-based showerhead electrode 20, also shown in FIG. 2, comprises a frontside 22, a backside 24, a plurality of showerhead passages 26 extending from the backside 24 of the silicon-based showerhead electrode 20 to the frontside 22 of the silicon-based showerhead electrode 20, and an electrode-based probe assembly passage 28 configured to permit passage of at least a portion of the probe body 42 and accommodate the silicon-based cap 44 of the probe assembly 40 therein. By way of example only, according to one embodiment, the silicon-based showerhead electrode 20 comprises a single-piece, circular showerhead construction or a multi-component, circular showerhead construction comprising a circular central electrode and one or more peripheral electrodes arranged about the circumference of the central electrode.

Generally, the thermal control plate 30 and the silicon-based showerhead electrode 20 are engaged such that the frontside 32 of the thermal control plate 30 faces the backside 24 of the silicon-based showerhead electrode 20. According to one embodiment, shown in FIG. 2, the electrode assembly 10 further comprises a thermally conductive bonding material 74 positioned between the frontside 32 of the thermal control plate 30 and the backside 24 of the silicon-based showerhead electrode 20. According to another embodiment, the electrode assembly 10 further comprises a thermally conductive gasket positioned between the frontside 32 of the thermal control plate 30 and the backside 24 of the silicon-based showerhead electrode 20.

In addition, the thermal control plate 30 and the silicon-based showerhead electrode 20 generally are engaged such that at least one of the showerhead passages 26 in the showerhead electrode 20 generally is aligned with at least one of the process gas passages 36 in the thermal control plate 30. Thereby, a process gas provided to a plasma processing chamber in which the electrode assembly 10 is positioned may pass through the aligned process gas passages 36 and showerhead passages 26.

Further, the thermal control plate 30 and the silicon-based showerhead electrode 20 generally are engaged such that the electrode-based probe assembly passage 28 is at least partially aligned with the plate-based probe assembly passage 38. As such, the aligned electrode-based probe assembly passage 28 and plate-based probe assembly passage 38 may accommodate the probe assembly 40.

As shown in FIGS. 1 and 2, the electrically conductive probe body 42 of the probe assembly 40 comprises a head section 46 comprising a threaded external diameter 48. This threaded external diameter 48 is configured to mate with a threaded internal diameter 50 of the silicon-based cap 44. The mating of the threaded external diameter 48 of the probe body 42 and the threaded internal diameter 50 of the cap 44 releasably engages the silicon-based cap 44 and the probe body 42 and permits repetitive non-destructive engagement and disengagement of the silicon-based cap 44 and the probe body 42.

The electrically conductive probe body 42 further comprises a mid-section 52 comprising a threaded external diameter 54. This threaded external diameter 54 of the mid-section 52 is configured to mate with a threaded internal diameter 39 of the plate-based probe assembly passage 38 so as to releasably engage the thermal control plate 30 and the probe body 42.

The head section 46 of the electrically conductive probe body 42 may comprise a buttress 58 positioned between the threaded external diameter 48 of the head section 46 and the threaded external diameter 54 of the mid-section 52. The buttress 58 of the head section 46 of the electrically conductive probe body 42 may be configured to define a limitation to the engagement of the silicon-based cap 44 and the head section 46 of the electrically conductive probe body 42 so as to preclude engagement beyond the defined limitation.

Generally, the electrode assembly 10 is configured such that the handedness of the threaded engagement of the silicon-based cap 44 and the head section 46 of the probe body 42 and the handedness of the threaded engagement of the thermal control plate 30 and the mid-section 52 of the probe body 42 are of a common direction of rotation. As such, an application of torque to the silicon-based cap 44 in a tightening direction of rotation can tighten both the threaded engagement of the silicon-based cap 44 and the head section 46 of the probe body 42 and the threaded engagement of the thermal control plate 30 and the mid-section 52 of the probe body 42. The silicon-based showerhead electrode 20, the thermal control plate 30, and the probe assembly 40 may be configured such that a substantially planar face 66 of the silicon-based cap 44 and the frontside 22 of the showerhead electrode 20 lie in a common plane when the threaded engagement of the silicon-based cap 44 and the head section 46 of the probe body 42 and the threaded engagement of the thermal control plate 30 and the mid-section 52 of the probe body 42 are substantially fully engaged.

This configuration where the substantially planar face 66 of the silicon-based cap 44 and the frontside 22 of the showerhead electrode 20 lie in a common plane helps maintain charge uniformity in the plasma processing chamber. Further, to ensure structural integrity and help prevent contamination, the silicon-based material of the silicon-based cap 44 comprises, according to one embodiment, a thickness of at least approximately 0.25 cm between a threaded bore 68 defined by the threaded internal diameter 50 and the substantially planar face 66 of the silicon-based cap 44. According to another embodiment, the silicon-based material of the silicon-based cap 44 comprises a thickness between the threaded bore 68 defined by the threaded internal diameter 50 and the substantially planar face 66 of the silicon-based cap 44 of at least approximately 25% of the total thickness of the silicon-based showerhead electrode 20. These, or other, thicknesses of the silicon-based material of the silicon-based cap 44 between the threaded bore 50 and the substantially planar face 66 help to avoid contamination by sufficiently isolating the probe body 42 from a reactive species in communication with the showerhead electrode 20 and the substantially planar face 66 silicon-based cap 44 when the electrode assembly 20 is positioned within a plasma processing chamber.

The electrode assembly 10 may further comprise an o-ring 72 configured to form a gas tight seal between the threaded engagement of the mid-section 52 of the probe body 42 and the thermal control plate 30 and the gap 70 defined between the periphery 45 of the probe assembly 40 and the internal diameter 29 of the electrode-based probe assembly passage 28 of the silicon-based showerhead electrode 20. This o-ring 72 may help maintain an evacuated portion within a plasma processing chamber when the electrode assembly 10 is positioned within such.

The electrically conductive probe body 42, in addition to the head section 46 and the mid-section 52 described above, generally also comprises a tail section 62. This tail section 62 may comprise an electrical coupling 64 configured for electrically conductive coupling to a plasma monitoring device when the electrode assembly 10 is positioned within a plasma processing chamber.

According to one embodiment, shown in FIG. 3, the electrode assembly 10 is an upper electrode assembly 10 of a plasma processing chamber 80. The plasma processing chamber 80 generally further comprises a vacuum source 82, a process gas supply 84, a plasma power supply 86, and a substrate support 88. The vacuum source 82 is configured to at least partially evacuate the plasma processing chamber 80. The substrate support 88 is positioned in an evacuated portion of the plasma processing chamber 80 and comprises a substrate electrode spaced from the upper electrode assembly 10. Both the substrate electrode and the upper electrode assembly 10 are operatively coupled to the plasma power supply 86.

The upper electrode assembly 10 generally is configured to define a plasma partition 90 within the plasma processing chamber 80. The electrically conductive probe body 42 of the probe assembly 40 of the upper electrode assembly 10 typically is isolated from reactive species with the evacuated portion of the plasma processing chamber 80. As described above, this isolation of the probe body 42 from the reactive species substantially avoids contamination of the reactive species by the probe body 42.

For the purposes of describing and defining embodiments of the present invention it is noted that the term "substantially" is utilized herein to represent the inherent degree of uncertainty that may be attributed to any quantitative comparison, value, measurement, or other representation. For example, the silicon-based cap is configured of a silicon-based material substantially identical in composition to that of the silicon-based showerhead electrode. It is contemplated that an inherent degree of uncertainty may exist in configuring the silicon-based cap of silicon-based material identical to that of the silicon-based showerhead electrode. Further, an exactly identical composition of the silicon-based cap may not be necessary for purposes of the present invention. As such, the phrase "substantially identical" is used herein. The term "substantially" is also utilized herein to represent the degree by which a quantitative representation may vary from a stated reference without resulting in a change in the basic function of the subject matter at issue. For example, the silicon-based cap comprises a substantially planar face. It is contemplated that some variation from a planar face may be permissible and not change the basic function of the silicon-based cap, the probe assembly, or the electrode assembly. As such, the phrase "substantially planar" is used herein.

It is noted that recitations herein of a component of the present invention being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "generally" and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present invention or to emphasize alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims. More specifically, although some aspects of the present invention may be identified herein as preferred or particularly advantageous, it is contemplated that the present invention is not necessarily limited to these preferred aspects of the invention.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the open-ended preamble term "comprising."

What is claimed is:

1. An electrode assembly comprising a silicon-based showerhead electrode comprising silicon, a thermal control plate, and a probe assembly, wherein:

the probe assembly is electrically isolated from the silicon-based showerhead electrode and comprises an electrically conductive probe body and a silicon-based cap that comprises silicon and is configured of a silicon-based material that comprises silicon and is substantially identical in composition to that of the silicon-based showerhead electrode;

the thermal control plate comprises a frontside, a backside, one or more process gas passages configured to direct a process gas to the frontside of the thermal control plate, and a probe assembly passage of the thermal control plate configured to permit passage of at least a portion of the electrically conductive probe body;

the silicon-based showerhead electrode comprises a frontside, a backside, a plurality of showerhead passages extending from the backside of the silicon-based showerhead electrode to the frontside of the silicon-based showerhead electrode, and an probe assembly passage of the silicon-based showerhead electrode configured to permit passage of at least a portion of the electrically conductive probe body and accommodate the silicon-based cap of the probe assembly therein;

the thermal control plate and the silicon-based showerhead electrode are engaged such that the frontside of the thermal control plate faces the backside of the silicon-based showerhead electrode, at least one of the showerhead passages in the silicon-based showerhead electrode is aligned with at least one of the process gas passages in the thermal control plate, and the probe assembly passage of the silicon-based showerhead electrode is at least partially aligned with the probe assembly passage of the thermal control plate;

the electrically conductive probe body comprises a head section comprising a threaded external diameter configured to mate with a threaded internal diameter of the silicon-based cap so as to releasably engage the silicon-based cap and the probe body and permit repetitive nondestructive engagement and disengagement of the silicon-based cap and the probe body;

the electrically conductive probe body comprises a midsection comprising a threaded external diameter configured to mate with a threaded internal diameter of the probe assembly passage of the thermal control plate so as to releasably engage the thermal control plate and the probe body;

the electrically conductive probe body comprises a tail section comprising an electrical coupling configured for electrically conductive coupling to a plasma monitoring device;

the electrode assembly is configured such that the handedness of the threaded engagement of the silicon-based cap and the head section of the probe body and the handedness of the threaded engagement of the thermal control plate and the mid-section of the probe body are of a common direction of rotation such that an application of torque to the silicon-based cap in a tightening direction of rotation can tighten both the threaded engagement of the silicon-based cap and the head section of the probe body and the threaded engagement of the thermal control plate and the mid-section of the probe body; and the silicon-based showerhead electrode, the thermal control plate, and the probe assembly are configured such that a substantially planar face of the silicon-based cap and the frontside of the silicon-based showerhead electrode lie in a common plane when the threaded engagement of the silicon-based cap and the head section of the probe body and the threaded engagement of the thermal control plate and the mid-section of the probe body are substantially fully engaged.

2. An electrode assembly as claimed in claim 1, wherein the head section of the electrically conductive probe body further comprises a buttress positioned between the threaded external diameter of the head section and the threaded external diameter of the mid-section.

3. An electrode assembly as claimed in claim 2, wherein the buttress of the head section of the electrically conductive probe body is configured to define a limitation to the engagement the silicon-based cap and the head section of the electrically conductive probe body so as to preclude engagement beyond the defined limitation.

4. An electrode assembly as claimed in claim 1, wherein the silicon-based material of the silicon-based cap comprises a thickness of at least approximately 0.25 cm between a threaded bore defined by the threaded internal diameter and the substantially planar face of the silicon-based cap.

5. An electrode assembly as claimed in claim 1, wherein the silicon-based material of the silicon-based cap comprises a thickness between a threaded bore defined by the threaded internal diameter and the substantially planar face of the silicon-based cap of at least approximately 25% of the total thickness of the silicon-based showerhead electrode.

6. An electrode assembly as claimed in claim 1, wherein the silicon-based material of the silicon-based cap comprises single crystal silicon.

7. An electrode assembly as claimed in claim 1, wherein the silicon-based material of the silicon-based cap comprises polysilicon, silicon nitride, silicon carbide, boron carbide, aluminum nitride, aluminum oxide, or combinations thereof.

8. An electrode assembly as claimed in claim 1, wherein the silicon-based showerhead electrode comprises a single-piece, circular showerhead construction or a multi-component, circular showerhead construction comprising a circular central electrode and one or more peripheral electrodes arranged about the circumference of the central electrode.

9. An electrode assembly as claimed in claim 1, wherein the electrode assembly further comprises a thermally conductive gasket positioned between the frontside of the thermal control plate and the backside of the silicon-based showerhead electrode.

10. An electrode assembly as claimed in claim 1, wherein the electrode assembly further comprises a thermally conductive bonding material positioned between the frontside of the thermal control plate and the backside of the silicon-based showerhead electrode.

11. An electrode assembly as claimed in claim 1, wherein the electrode assembly comprises a gap defined between a periphery of the probe assembly and the internal diameter of the probe assembly passage of the silicon-based showerhead electrode such that the probe assembly is electrically isolated from the silicon-based showerhead electrode.

12. An electrode assembly as claimed in claim 11, wherein the electrode assembly further comprises an o-ring configured to form a gas tight seal between the threaded engagement of the mid-section of the probe body and the thermal control plate and the gap defined between the periphery of the probe assembly and the internal diameter of the probe assembly passage of the silicon-based showerhead electrode.

13. An electrode assembly as claimed in claim 1, wherein the electrode assembly is an upper electrode assembly of a plasma processing chamber, the plasma processing chamber further comprising a vacuum source, a process gas supply, a plasma power supply, and a substrate support.

14. An electrode assembly as claimed in claim 13, wherein:
the vacuum source is configured to at least partially evacuate the plasma processing chamber;
the substrate support is positioned in an evacuated portion of the plasma processing chamber and comprises a substrate electrode spaced from the upper electrode assembly; and
the substrate electrode and the upper electrode assembly are operatively coupled to the plasma power supply.

15. An electrode assembly as claimed in claim 14, wherein:
the upper electrode assembly is configured to define a plasma partition within the plasma processing chamber; and
the electrically conductive probe body of the probe assembly of the upper electrode assembly is isolated from reactive species within the evacuated portion of the plasma processing chamber so as to substantially avoid contamination of the reactive species by the electrically conductive probe body.

16. A plasma processing chamber comprising a vacuum source, a process gas supply, a plasma power supply, a substrate support, and an upper electrode assembly, wherein:
the vacuum source is configured to at least partially evacuate the plasma processing chamber;
the substrate support is positioned in an evacuated portion of the plasma processing chamber and comprises a substrate electrode spaced from the upper electrode assembly;
the substrate electrode and the upper electrode assembly are operatively coupled to the plasma power supply;
the upper electrode assembly comprises a silicon-based showerhead electrode comprising silicon, a thermal control plate, and a probe assembly;
the probe assembly is electrically isolated from the silicon-based showerhead electrode and comprises an electrically conductive probe body and a silicon-based cap that comprises silicon and is configured of a silicon-based material that comprises silicon and is substantially identical in composition to that of the silicon-based showerhead electrode;
the thermal control plate comprises a frontside, a backside, one or more process gas passages configured to direct a process gas to the frontside of the thermal control plate, and a probe assembly passage of the thermal control plate configured to permit passage of at least a portion of the electrically conductive probe body;

the silicon-based showerhead electrode comprises a frontside, a backside, a plurality of showerhead passages extending from the backside of the silicon-based showerhead electrode to the frontside of the silicon-based showerhead electrode, and an probe assembly passage of the silicon-based showerhead electrode configured to permit passage of at least a portion of the electrically conductive probe body and accommodate the silicon-based cap of the probe assembly therein;

the thermal control plate and the silicon-based showerhead electrode are engaged such that the frontside of the thermal control plate faces the backside of the silicon-based showerhead electrode, at least one of the showerhead passages in the silicon-based showerhead electrode is aligned with at least one of the process gas passages in the thermal control plate, and the probe assembly passage of the silicon-based showerhead electrode is at least partially aligned with the probe assembly passage of the thermal control plate;

the electrically conductive probe body comprises a head section comprising a threaded external diameter configured to mate with a threaded internal diameter of the silicon-based cap so as to releasably engage the silicon-based cap and the probe body and permit repetitive non-destructive engagement and disengagement of the silicon-based cap and the probe body;

the electrically conductive probe body comprises a mid-section comprising a threaded external diameter configured to mate with a threaded internal diameter of the probe assembly passage of the thermal control plate so as to releasably engage the thermal control plate and the probe body;

the electrically conductive probe body comprises a tail section comprising an electrical coupling configured for electrically conductive coupling to a plasma monitoring device;

the electrode assembly is configured such that the handedness of the threaded engagement of the silicon-based cap and the head section of the probe body and the handedness of the threaded engagement of the thermal control plate and the mid-section of the probe body are of a common direction of rotation such that an application of torque to the silicon-based cap in a tightening direction of rotation can tighten both the threaded engagement of the silicon-based cap and the head section of the probe body and the threaded engagement of the thermal control plate and the mid-section of the probe body; and the silicon-based showerhead electrode, the thermal control plate, and the probe assembly are configured such that a substantially planar face of the silicon-based cap and the frontside of the silicon-based showerhead electrode lie in a common plane when the threaded engagement of the silicon-based cap and the head section of the probe body and the threaded engagement of the thermal control plate and the mid-section of the probe body are substantially fully engaged.

17. A plasma processing chamber as claimed in claim 16, wherein:

the upper electrode assembly is configured to define a plasma partition within the plasma processing chamber; and the electrically conductive probe body of the probe assembly of the upper electrode assembly is isolated from reactive species within an evacuated portion of the plasma processing chamber so as to substantially avoid contamination of the reactive species by the electrically conductive probe body.

18. An electrode assembly as claimed in claim 16, wherein the electrode assembly comprises a gap defined between a periphery of the probe assembly and the internal diameter of the probe assembly passage of the silicon-based showerhead electrode such that the probe assembly is electrically isolated from the silicon-based showerhead electrode.

19. A plasma processing chamber as claimed in claim 18, wherein the electrode assembly further comprises an o-ring configured to form a gas tight seal between the threaded engagement of the mid-section of the probe body and the thermal control plate and the gap defined between the periphery of the probe assembly and the internal diameter of the probe assembly passage of the silicon-based showerhead electrode.

20. An electrode assembly comprising a silicon-based showerhead electrode comprising silicon, a thermal control plate, and a probe assembly, wherein:

the probe assembly is electrically isolated from the silicon-based showerhead electrode by a gap defined between a periphery of the probe assembly and an probe assembly passage of the silicon-based showerhead electrode;

the probe assembly comprises an electrically conductive probe body, a silicon-based cap that comprises silicon and is configured of a silicon-based material that comprises silicon and is substantially identical in composition to that of the silicon-based showerhead electrode, and an o-ring;

the thermal control plate comprises a frontside, a backside, one or more process gas passages configured to direct a process gas to the frontside of the thermal control plate, and a probe assembly passage of the thermal control plate configured to permit passage of at least a portion of the electrically conductive probe body;

the silicon-based showerhead electrode comprises a frontside, a backside, a plurality of showerhead passages extending from the backside of the silicon-based showerhead electrode to the frontside of the silicon-based showerhead electrode, and the probe assembly passage of the silicon-based showerhead electrode configured to permit passage of at least a portion of the electrically conductive probe body and accommodate the silicon-based cap of the probe assembly therein;

the thermal control plate and the silicon-based showerhead electrode are engaged such that the frontside of the thermal control plate faces the backside of the silicon-based showerhead electrode, at least one of the showerhead passages in the silicon-based showerhead electrode is aligned with at least one of the process gas passages in the thermal control plate, and the probe assembly passage of the silicon-based showerhead electrode is at least partially aligned with the probe assembly passage of the thermal control plate;

the electrically conductive probe body comprises a head section comprising a threaded external diameter configured to mate with a threaded internal diameter of the silicon-based cap so as to releasably engage the silicon-based cap and the probe body and permit repetitive non-destructive engagement and disengagement of the silicon-based cap and the probe body;

the silicon-based material of the silicon-based cap comprises a thickness of at least approximately 0.25 cm between a threaded bore defined by the threaded internal diameter and a substantially planar face of the silicon-based cap;

the electrically conductive probe body comprises a mid-section comprising a threaded external diameter configured to mate with a threaded internal diameter of the probe assembly passage of the thermal control plate so as to releasably engage the thermal control plate and the probe body;

the o-ring is configured to form a gas tight seal between the threaded engagement of the mid-section of the probe body and the thermal control plate and the gap defined between the periphery of the probe assembly and the internal diameter of the probe assembly passage of the silicon-based showerhead electrode;

the electrically conductive probe body comprises a tail section comprising an electrical coupling configured for electrically conductive coupling to a plasma monitoring device;

the electrode assembly is configured such that the handedness of the threaded engagement of the silicon-based cap and the head section of the probe body and the handedness of the threaded engagement of the thermal control plate and the mid-section of the probe body are of a common direction of rotation such that an application of torque to the silicon-based cap in a tightening direction of rotation can tighten both the threaded engagement of the silicon-based cap and the head section of the probe body and the threaded engagement of the thermal control plate and the mid-section of the probe body; and the silicon-based showerhead electrode, the thermal control plate, and the probe assembly are configured such that the substantially planar face of the silicon-based cap and the frontside of the silicon-based showerhead electrode lie in a common plane when the threaded engagement of the silicon-based cap and the head section of the probe body and the threaded engagement of the thermal control plate and the mid-section of the probe body are substantially fully engaged.

\* \* \* \* \*

UNITED STATES PATENT AND TRADEMARK OFFICE
CERTIFICATE OF CORRECTION

PATENT NO.       : 8,043,470 B2  
APPLICATION NO.  : 11/943673  
DATED            : October 25, 2011  
INVENTOR(S)      : Hardin et al.

Page 1 of 1

It is certified that error appears in the above-identified patent and that said Letters Patent is hereby corrected as shown below:

Col. 6, Claim 1, Line 40, "an probe" should read --a probe--;

Col. 7, Claim 3, Line 34, "engagement the" should read --engagement of the--;

Col. 9, Claim 16, Line 5, "and an probe" should read --and a probe--; and

Col. 10, Claim 20, Line 20, "an probe" should read --a probe--.

Signed and Sealed this  
Seventeenth Day of April, 2012

David J. Kappos  
*Director of the United States Patent and Trademark Office*